United States Patent
Lee et al.

(10) Patent No.: US 9,859,154 B2
(45) Date of Patent: Jan. 2, 2018

(54) STRUCTURE AND FORMATION METHOD OF INTERCONNECT STRUCTURE OF SEMICONDUCTOR DEVICE

(71) Applicant: Taiwan Semiconductor Manufacturing Co., Ltd., Hsinchu (TW)

(72) Inventors: Shao-Kuan Lee, Kaohsiung (TW); Hsin-Yen Huang, New Taipei (TW); Hai-Ching Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/067,807

(22) Filed: Mar. 11, 2016

(65) Prior Publication Data

US 2017/0263549 A1    Sep. 14, 2017

(51) Int. Cl.
*H01L 21/768* (2006.01)
*H01L 23/532* (2006.01)

(52) U.S. Cl.
CPC .. *H01L 21/76835* (2013.01); *H01L 21/76828* (2013.01); *H01L 21/76829* (2013.01); *H01L 23/5329* (2013.01)

(58) Field of Classification Search
CPC ......... H01L 21/76835; H01L 21/76828; H01L 21/76829; H01L 21/02321; H01L 21/02203; H01L 21/02332; H01L 23/5329
See application file for complete search history.

(56) References Cited

U.S. PATENT DOCUMENTS

| | | | | |
|---|---|---|---|---|
| 2003/0042605 A1* | 3/2003 | Andideh | ........... | H01L 21/02126 257/741 |
| 2006/0091401 A1* | 5/2006 | Yoshizawa | ........ | H01L 21/31144 257/77 |
| 2006/0261434 A1* | 11/2006 | Lazovsky | .............. | B82Y 30/00 257/499 |
| 2007/0023870 A1* | 2/2007 | Dubois | ................. | C08L 101/12 257/642 |
| 2009/0203201 A1* | 8/2009 | Masuda | ........... | H01L 21/02126 438/585 |
| 2010/0181682 A1* | 7/2010 | Arai | .................. | H01L 21/02126 257/774 |
| 2011/0147947 A1* | 6/2011 | Kanayama | ............ | B24B 37/042 257/774 |
| 2011/0260271 A1* | 10/2011 | Fukui | ..................... | H01L 43/08 257/421 |
| 2014/0015104 A1* | 1/2014 | Su | ......................... | H01L 21/225 257/611 |

(Continued)

*Primary Examiner* — Daniel Luke
(74) *Attorney, Agent, or Firm* — Birch, Stewart, Kolasch & Birch, LLP

(57) ABSTRACT

Structures and formation methods of a semiconductor device structure are provided. The semiconductor device structure includes a semiconductor substrate and a dielectric layer over the semiconductor substrate. The dielectric layer has a protection region and a lower portion that is between the protection region and the semiconductor substrate. The protection region contains more carbon than the dielectric layer. The semiconductor device structure also includes a conductive feature penetrating through the protection region, and a lower portion of the conductive feature is surrounded by the lower portion of the dielectric layer.

20 Claims, 5 Drawing Sheets

(56) References Cited

U.S. PATENT DOCUMENTS

| | | | | |
|---|---|---|---|---|
| 2014/0367356 A1* | 12/2014 | Dubois | ............ | H01L 21/02203 |
| | | | | 216/12 |
| 2015/0228586 A1* | 8/2015 | Usami | ............... | H01L 23/53238 |
| | | | | 257/751 |
| 2015/0311066 A1* | 10/2015 | Bruce | ............... | H01L 21/02315 |
| | | | | 438/694 |

* cited by examiner

STRUCTURE AND FORMATION METHOD OF INTERCONNECT STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
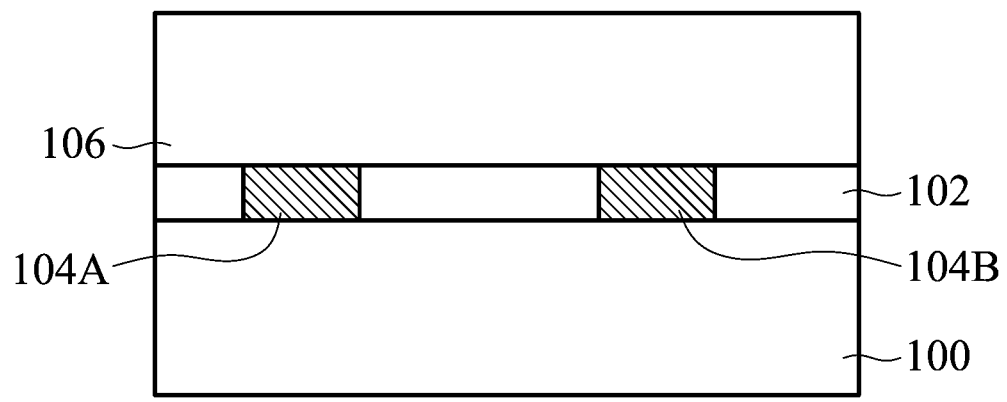
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a semiconductor device structure, in accordance with some embodiments. As shown in FIG. 1A, a semiconductor substrate 100 is provided. In some embodiments, the semiconductor substrate 100 includes a semiconductor wafer, a portion of a semiconductor wafer, or a semiconductor die. The semiconductor wafer (such as a silicon wafer) may contain device elements such as active devices and/or passive devices. In some embodiments, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, an interconnection structure is formed on the semiconductor substrate 100. The interconnection structure includes an interlayer dielectric layer 102 and multiple conductive features including conductive features 104A and 104B. The conductive features 104A and 104B may include conductive lines, conductive vias, and/or conductive contacts. In some embodiments, the interlayer dielectric layer 102 includes multiple dielectric sub-layers. Multiple conductive features such as conductive contacts, conductive vias, and conductive lines are formed in the interlayer dielectric layer 102.

Afterwards, one or more dielectric layers and conductive features are formed on the conductive features 104A and 104B and the interlayer dielectric layer 102 to continue the formation of the interconnection structure. In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

The device elements are interconnected through the interconnection structure over the semiconductor substrate 100 to form integrated circuit devices. For example, one of the conductive features 104A and 104B may be electrically connected to a doped region formed in the semiconductor substrate 100 through some of the conductive features including, for example, conductive vias, conductive lines, and/or conductive contacts. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, a dielectric layer 106 is deposited over the interlayer dielectric layer 102 and the conductive features 104A and 104B, in accordance with some embodiments. In some embodiments, an etch stop layer (not shown) is formed between the dielectric layer 106 and the interlayer dielectric layer 102. The etch stop layer may be used to assist in the formation of openings that will be formed in the dielectric layer 106. The openings may be used to contain conductive vias and/or conductive lines.

In some embodiments, the etch stop layer is made of silicon nitride, silicon oxynitride, silicon carbide, silicon carbon nitride, another suitable material, or a combination thereof. In some embodiments, the etch stop layer is deposited using a chemical vapor deposition (CVD) process, an atomic layer deposition (ALD) process, a spin-on process, another applicable process, or a combination thereof. Many variations and/or modifications can be made to embodiments of the disclosure. In some other embodiments, the the etch stop layer is not formed.

In some embodiments, the dielectric layer 106 is made of a low dielectric constant (low-k) material, silicon oxide, silicon oxynitride, borosilicate glass (BSG), phosphoric silicate glass (PSG), borophosphosilicate glass (BPSG), fluorinated silicate glass (FSG), another suitable material, or a combination thereof. In some embodiments, the dielectric layer 106 contains substantially no nitrogen. In some embodiments, the dielectric layer 106 includes multiple sub-layers. In some embodiments, the dielectric layer 106 is deposited using a CVD process, an ALD process, a spin-on process, a spray coating process, another applicable process, or a combination thereof.

The low-k material may have a dielectric constant smaller than that of silicon dioxide. For example, the low-k material has a dielectric constant that is in a range from about 1.5 to about 3.5. As the density of semiconductor devices increases and the size of circuit elements becomes smaller, the resistance capacitance (RC) delay time increasingly dominates circuit performance. Therefore, using a low-k dielectric material as the dielectric layer 106 is helpful for reducing the RC delay and improving circuit performance.

A wide variety of low-k material may be used for forming the dielectric layer 106. In some embodiments, the dielectric layer 106 includes a porous dielectric material, an organic polymer, an organic silica glass, SiOF series material, a hydrogen silsesquioxane (HSQ) series material, a methyl silsesquioxane (MSQ) series material, a porous organic series material, a spin-on inorganic dielectric, a spin-on organic dielectric, another suitable material, or a combination thereof. In some embodiments, the dielectric layer 106 includes a silicon, oxygen, and carbon-containing material. The carbon element may be chemically bonded to the silicon element or oxygen element.

Figure 1B:
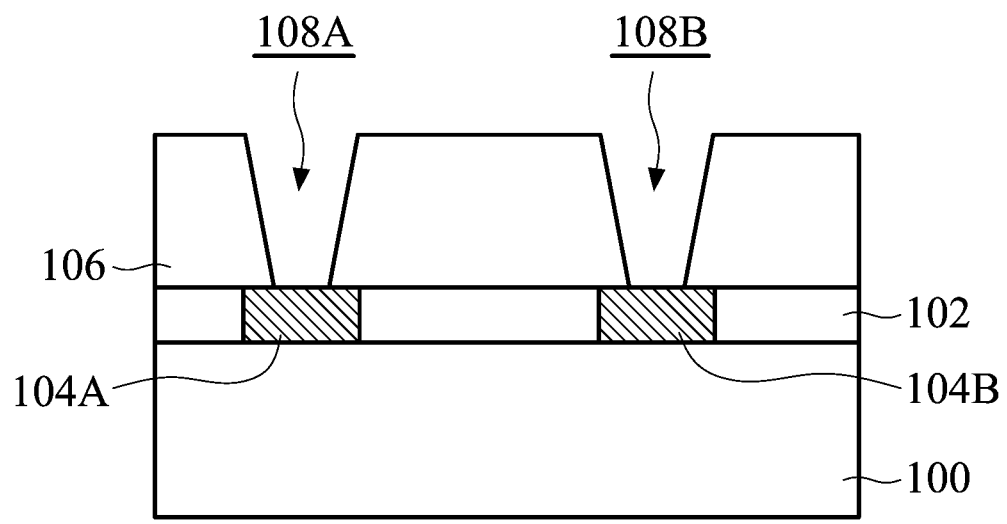

Afterwards, openings including openings 108A and 108B are formed in the dielectric layer 106, as shown in FIG. 1B in accordance with some embodiments. In some embodiments, the openings 108A and 108B expose the conductive features 104A and 104B, respectively. In some embodiments, the openings 108A and 108B are via holes, trenches, and/or contact holes. The formation of the openings 108A and 108B may involve one or more photolithography processes and etching processes.

Figure 1C:
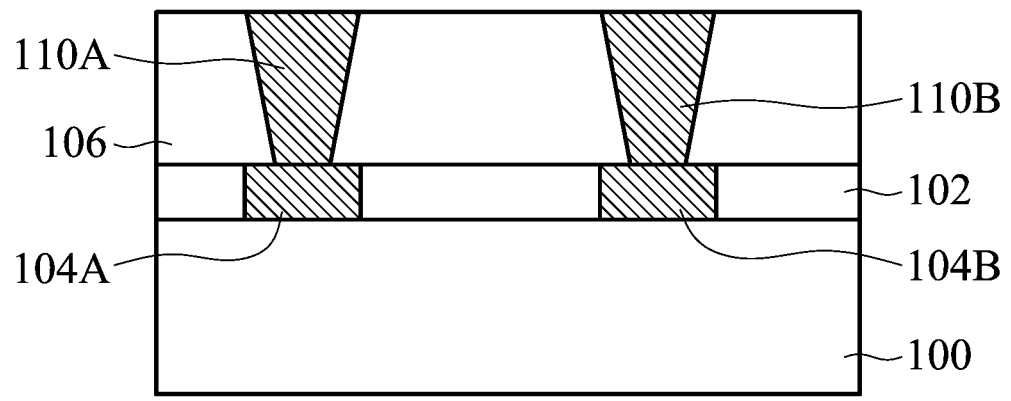

As shown in FIG. 1C, conductive features 110A and 110B are respectively formed in the openings 108A and 108B, in accordance with some embodiments. The conductive features 110A and 110B may be used as conductive vias, conductive lines, and/or conductive contacts. In some embodiments, the conductive features 110A and 110B include copper, aluminum, tungsten, titanium, cobalt, gold, platinum, graphene, carbon nanotube, another suitable material, or a combination thereof. Each of the conductive features 110A and 110B may include multiple sub-layers.

In some embodiments, a barrier layer (not shown) is formed between the dielectric layer 106 and the conductive feature 110A or 110B. The barrier layer may be used to prevent metal ions of conductive features from diffusing into the dielectric layer 106. In some embodiments, the barrier layer includes multiple sub-layers including a glue layer (not shown). The glue layer may be used to improve adhesion between the barrier layer and a subsequently formed layer.

In some embodiments, the barrier layer is made of titanium nitride (TiN), tantalum nitride (TaN), Ta, Ti, TiW, another suitable material, or a combination thereof. The glue layer may be made of Ta, Ti, another suitable material, or a combination thereof. Many variations and/or modifications can be made to embodiments of the disclosure. In some other embodiments, the barrier layer is not formed.

In some embodiments, the barrier layer and one or more conductive layers are deposited over the dielectric layer 106 to fill the openings 108A and 108B. The barrier layer and the conductive layer(s) may be deposited using a physical vapor deposition (PVD) process, a chemical vapor deposition (CVD) process, an atomic layer deposition (ALD) process, an electrochemical deposition process, an electroless plating process, a spin-on process, a spray coating process, another applicable process, or a combination thereof.

In some embodiments, a planarization process is used to remove the portions of the barrier layer and the conductive layer(s) outside of the openings 108A and 108B. As a result, the remaining portions of these layers form the conductive features 110A and 110B, as shown in FIG. 1C. In some embodiments, the planarization process includes a chemical mechanical polishing (CMP) process, a grinding process, a dry polishing process, an etching process, another applicable process, or a combination thereof. In some embodiments, the top surfaces of the dielectric layer 106 and the conductive features 110A and 110B are substantially coplanar after the planarization process. In some other embodiments, the top surfaces of the conductive features 110A and 110B are slightly higher than the top surface of the dielectric layer 106.

Figure 1D:
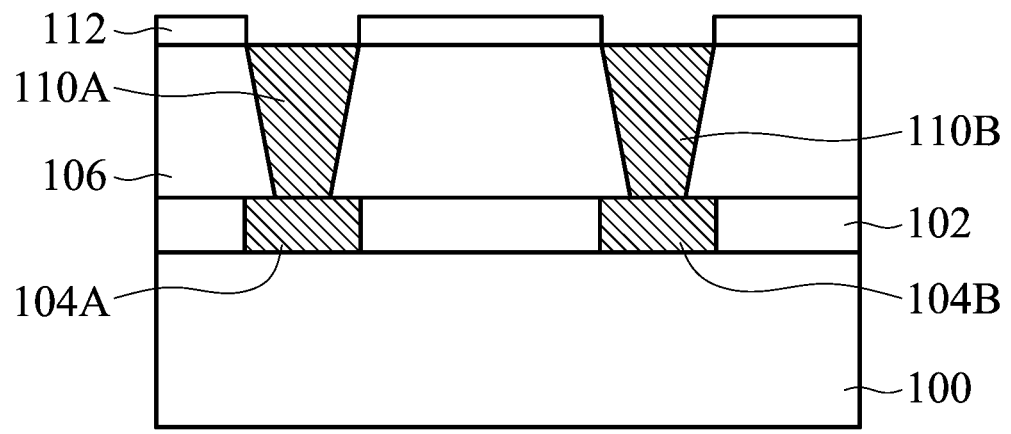

As shown in FIG. 1D, a protection material layer 112 is formed on the dielectric layer 106, in accordance with some embodiments. The protection material layer 112 may be used for forming a protection region (and/or a protection layer) in (and/or on) the dielectric layer 106 to protect the dielectric layer 106 from being damaged during a subsequent process. In some embodiments, the protection material layer 112 includes multiple sub-layers. In some embodiments, some of the sub-layers have different materials. One or more materials may be introduced into the dielectric layer 106 to form the protection region (and/or a protection layer) in (and/or on) the dielectric layer 106.

The subsequent process may be a plasma-involved process and/or a process involving ion bombardment. In some embodiments, the protection material layer 112 is directly used to protect the dielectric layer 106 from being damaged during a subsequent process. The protection material layer 112 may have a thickness that is in a range from about 10 Å to about 30 Å.

In some embodiments, the protection material layer 112 is a silicon, oxygen, and carbon-containing material. In some embodiments, the protection material layer 112 is a silicon, oxygen, carbon, and nitrogen-containing material. In some embodiments, the protection material layer 112 includes a polymer material. In some other embodiments, the protection material layer 112 is a polymer material containing silicon, oxygen, and carbon. In some other embodiments, the protection material layer 112 is a polymer material containing silicon, oxygen, carbon, and nitrogen. In some embodiments, the protection material layer 112 is formed selectively on the dielectric layer 106. In some embodiments, the protection material layer 112 is substantially not formed or left on the conductive features 110A and 110B.

Figure 3:
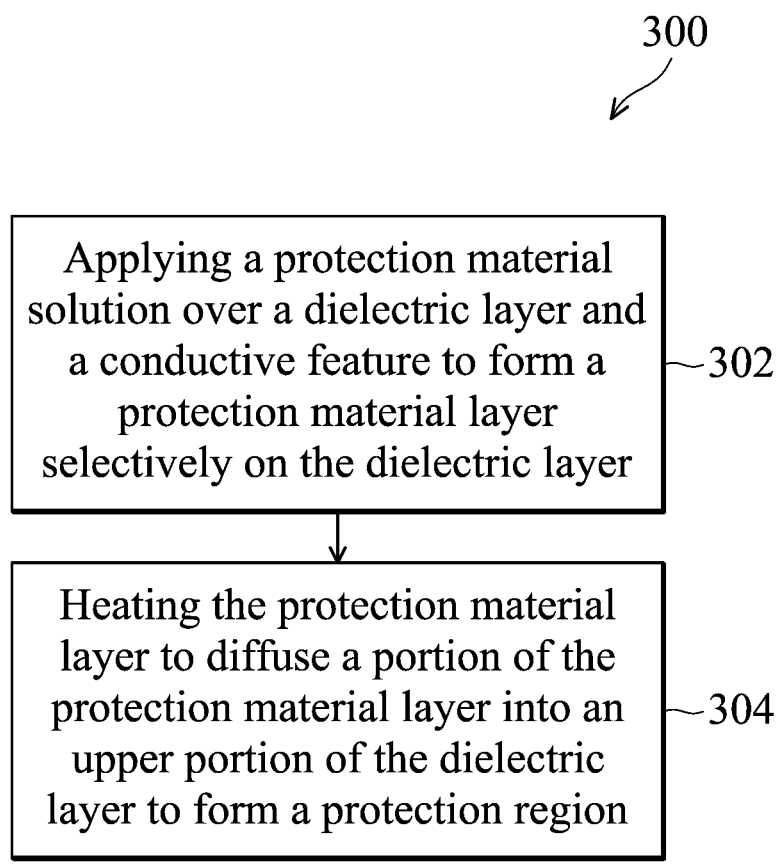
FIG. 3 is a flow chart illustrating a method for forming a protection material layer during the formation of a semiconductor device structure, in accordance with some embodiments.

In some embodiments, the protection material layer 112 is selectively formed on the dielectric layer 106 using a spin-on process, a spray coating process, a selective CVD process, another applicable process, or a combination thereof. FIG. 3 is a flow chart that illustrates a method 300 for forming the protection material layer 112, in accordance with some embodiments.

Referring to FIGS. 1D and 3, the method 300 includes an operation 302 in which a protection material solution is applied on the dielectric layer 106 and the conductive features 110A and 110B to form the protection material layer 112 selectively on the dielectric layer 106. The protection material layer 112 may almost not be formed on the conductive features 110A and 110B. Alternatively, the protection material layer 112 may be easily removed from the conductive features 110A and 110B. In some embodiments, the protection material solution is applied on the dielectric layer 106 and the conductive features 110A and 110B using a spin-on process, a spray coating process, another applicable process, or a combination thereof.

In some embodiments, the protection material solution includes one or more compounds that include charged functional groups. In some embodiments, the one or more compounds in the protection material solution include charged functional groups such as OH–, NH+, P+, another suitable functional group, or a combination thereof. In some embodiments, the solvent used in the protection material solution includes water, alcohol, propylene glycol monomethyl ether acetate, ethylene glycol, another suitable solvent, or a combination thereof.

The protection material solution may be applied on both of the dielectric layer 106 and the conductive features 110A and 110B. In some embodiments, the adhesion between the protection material layer 112 and the dielectric layer 106 is much stronger than that between the protection material layer 112 and the conductive features 110A and 110B. Therefore, the portion of the protection material layer 112, that is original deposited on the conductive features 110A and 110B, may be easily removed using, for example, a water rinsing. In some other cases, there is substantially no protection material layer deposited on the conductive features 110A and 110B.

In some embodiments, the pH value of the protection material solution is fine-tuned to ensure that the protection material layer 112 is selectively formed on the dielectric layer 106. In some embodiments, the protection material solution has a pH value that is in a range from about 2 to about 4. In some cases, if the pH value of the protection material solution is greater than 4 or greater than 5, the protection material layer 112 may have adhesion with the conductive features 110A and 110B that is too strong. As a result, the portion of the protection material layer 112 on the conductive features 110A and 110B may be difficult to remove. A water rinsing may not be able to remove the unwanted portions of the protection material layer 112 on the conductive features 110A and 110B. In some other cases, if the pH value of the protection material solution is smaller than 2, the conductive features 110A and 110B may be damaged by the protection material solution.

However, embodiments of the disclosure are not limited to the embodiments mentioned above. In some other embodiments, the pH value of the protection material solution has a different range. For example, the pH value of the protection material solution may be in a range from about 3 to about 5.

Figure 1E:
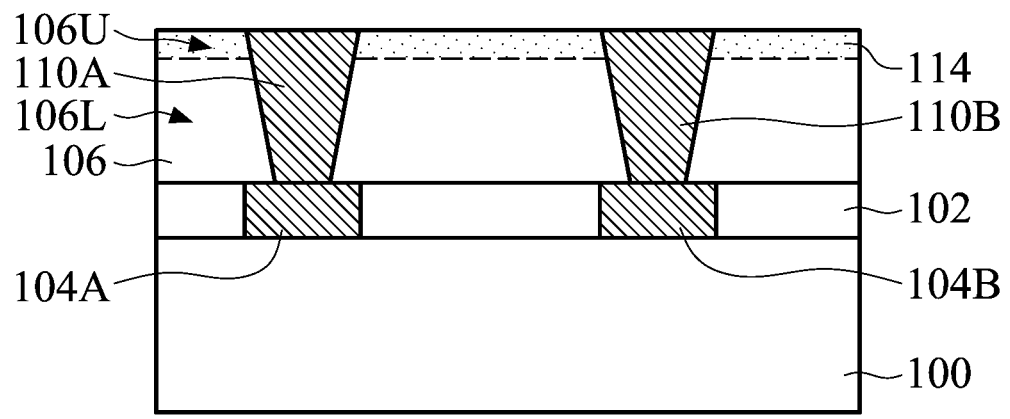

Afterwards, a portion of or all of the protection material layer 112 is introduced into the dielectric layer 106 to form the protection region (or a protection layer) 114, as shown in FIGS. 1D-1E in accordance with some embodiments. In some embodiments, the method 300 continues with an operation 304 in which the protection material layer 112 is heated to diffuse a portion of or all of the protection material layer 112 into an upper portion 106U of the dielectric layer 106 to form a protection region (or a protection layer) 114. In some embodiments, the protection material layer 112 is introduced into the dielectric layer 106 to form the protection region (or a protection layer) 114, as shown in FIGS. 1D-1E. In some embodiments, the protection material layer 112 is heated to induce diffusion the material of the protection material layer 112 into the dielectric layer 106.

In some embodiments, the dielectric layer 106 is a porous material, and the upper portion 106U of the dielectric layer 106 contains the material diffused from the protection material layer 112 originally on the dielectric layer 106. The material from the protection material layer 112 may partially or completely fill the pores in the upper portion 106U of the dielectric layer 106. The upper portion 106U of the dielectric layer 106 and the material diffused from the protection material layer 112 may together form the protection region 114 (or the protection layer 114). In some embodiments, the protection region 114 (or the protection layer 114) is in direct contact with a lower portion 106L of the dielectric layer 106 under the protection region 114 (or the protection layer 114).

As mentioned above, the protection material layer 112 includes a polymer material, in accordance with some embodiments. In some embodiments, the protection material layer 112 is heated at a temperature that is higher than the glass transition temperature (Tg) of the polymer material. It may be easier for the material of the protection material layer 112 to diffuse into the dielectric layer 106 after being heated. In some embodiments, the protection material layer 112 is heated at a temperature that is in a range from about 150 degrees C. to about 400 degrees C. In some embodiments, the protection material layer 112 is heated for about 1 minute to about 15 minutes.

In some embodiments, the protection region (or the protection layer) 114 has a thickness that is in a range from about 10 Å to about 30 Å. In some embodiments, the top surfaces of the protection region (or the protection layer) 114 and the conductive features 110A and 110B are substantially coplanar. In these cases, the protection material layer 112 may completely diffused into the upper portion 106U of the dielectric layer 106 to form the protection region (or the protection layer) 114.

As mentioned above, the protection material layer 112 is a silicon, oxygen, and carbon-containing material, in accordance with some embodiments. In some other embodiments, the protection material layer 112 is a silicon, oxygen, carbon, and nitrogen-containing material. In some embodiments, the protection region (or the protection layer) 114 contains more carbon than the lower portion 106L of the dielectric layer 106 under the protection region (or the protection layer) 114. In some embodiments, a carbon concentration of the protection region (or the protection layer) 114 gradually decreases along a direction from a top of the protection region (or the protection layer) 114 towards the lower portion 106L of the dielectric layer 106.

In some embodiments, the protection region (or the protection layer) 114 contains more nitrogen than the lower portion 106L of the dielectric layer 106. In some embodiments, a nitrogen concentration of the protection region (or the protection layer) 114 gradually decreases along a direction from a top of the protection region (or the protection layer) 114 towards the lower portion 106L of the dielectric layer 106.

In some embodiments, the protection region (or the protection layer) 114 is denser than the lower portion 106L of the dielectric layer 106 that is between the protection region (or the protection layer) 114 and the semiconductor substrate 100. In some embodiments, the lower portion 106L of the dielectric layer 106 is thicker than the protection region (or the protection layer) 114. In some embodiments, the protection region (or the protection layer) 114 has a greater dielectric constant than the lower portion 106L of the dielectric layer 106. Many variations and/or modifications can be made to embodiments of the disclosure. In some other embodiments, the dielectric constants of the protection region (or the protection layer) 114 and the lower portion 106L of the dielectric layer 106 are substantially the same.

Figure 1F:
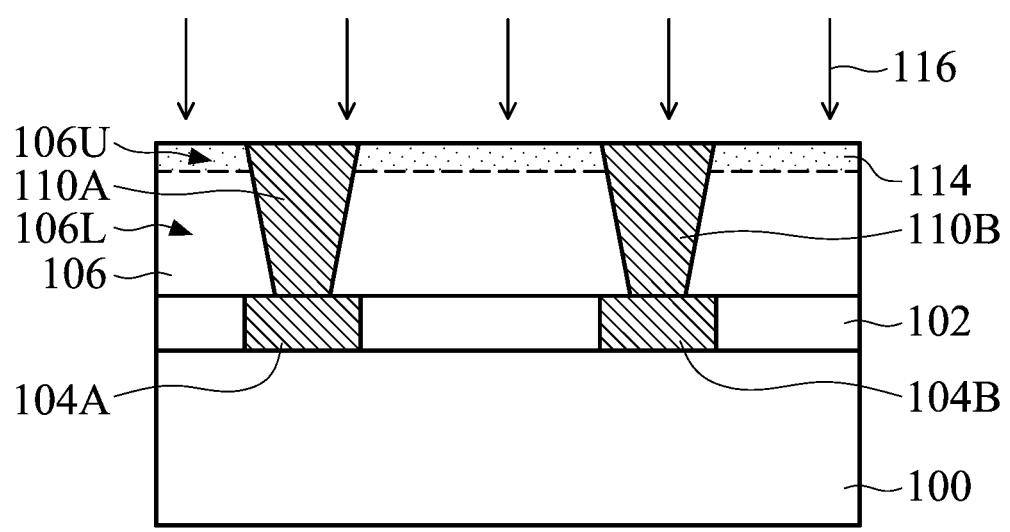

As shown in FIG. 1F, a surface modification treatment 116 is performed on the protection region (or the protection layer) 114 and the conductive features 110A and 110B to clean the surfaces of the conductive features 110A and 110B, in accordance with some embodiments. The surface modification treatment 116 may be used to remove oxide films or oxide residues formed on the conductive features 110A and 110B. Therefore, respective electrical connections between the conductive features and subsequently formed conductive elements may be improved.

In some embodiments, the surface modification treatment 116 is a plasma treatment. In some embodiments, the reaction gas used in the plasma treatment includes nitrogen, ammonia, hydrogen, another suitable gas, or a combination thereof. In some embodiments, the protection region (or the protection layer) 114 protects the dielectric layer 106 from being damaged during the surface modification treatment 116. For example, carbon depletion may be significantly reduced or prevented in the dielectric layer 106 during the surface modification treatment 116. The dielectric constant of the dielectric layer 106 may be maintained at a relatively low level, which is helpful for reducing the RC delay and improving circuit performance.

Figure 1G:
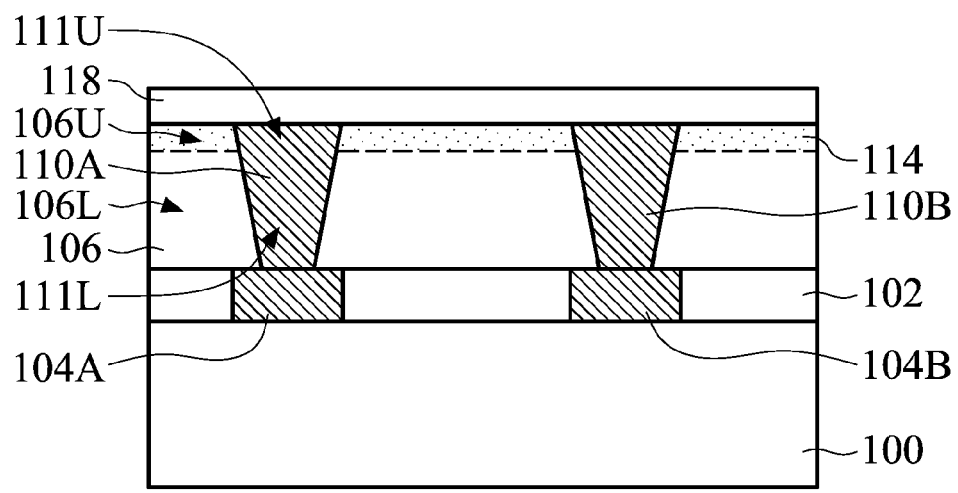

As shown in FIG. 1G, an etch stop layer 118 is deposited over the protection region (or the protection layer) 114 and the conductive features 110A and 110B, in accordance with some embodiments. In some embodiments, the etch stop layer 118 is made of silicon nitride, silicon oxynitride, silicon carbide, silicon carbon nitride, another suitable material, or a combination thereof. In some embodiments, the etch stop layer 118 includes multiple sub-layers. In some embodiments, the etch stop layer 118 is deposited using a chemical vapor deposition (CVD) process, an atomic layer deposition (ALD) process, a spin-on process, another applicable process, or a combination thereof. In some embodiments, the formation of the etch stop layer 118 involves plasma and/or ion bombardment. During the formation of the etch stop layer 118, the protection region (or the protection layer) 114 protects the dielectric layer 106 from being damaged. The quality and reliability of the dielectric layer 106 are significantly improved.

As shown in FIG. 1G, the lower portion 106L of the dielectric layer 106 and the protection region (or the protection layer) 114 together form the dielectric layer 106 that surrounds the conductive features 110A and 110B, in accordance with some embodiments. The upper portion 106U of the dielectric layer 106 (the protection region (or the protection layer) 114) surrounds an upper portion 111U of the conductive feature 110A, as shown in FIG. 1G. The lower portion 106L of the dielectric layer 106 surrounds a lower portion 111L of the conductive feature 110A, as shown in FIG. 1G. In some embodiments, each of the conductive features 110A and 110B penetrates through the protection region (or the protection layer) 114. In some embodiments, each of the conductive features 110A and 110B penetrates through the protection region (or the protection layer) 114 and the dielectric layer 106.

As mentioned above, the protection material layer 112 may be completely introduced into the upper portion 106U of the dielectric layer 106 to form the protection region (or protection layer) 114. Alternatively, the protection material layer 112 may be partially introduced into the dielectric layer 106 to form the protection region (or protection layer) 114. In some embodiments, the remaining portion of the protection material layer 112 may be removed during the surface modification treatment 116 and/or the formation of the etch stop layer 118. In some other embodiments, another process is performed to remove the remaining portion of the protection material layer 112. However, embodiments of the disclosure are not limited thereto. In some other embodiments, the remaining portion of the protection material layer 112 is left.

Figure 2:
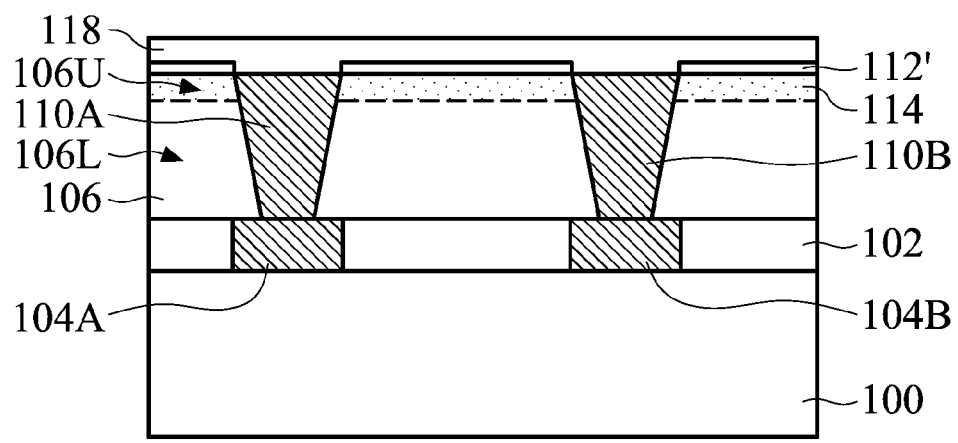
FIG. 2 is a cross-sectional view of a semiconductor device structure, in accordance with some embodiments.

FIG. 2 is a cross-sectional view of a semiconductor device structure, in accordance with some embodiments. As shown in FIG. 2, the remaining portion of the protection material layer 112 not being introduced into the dielectric layer 106 form a protection layer 112'. The protection layer 112' and the protection region (or protection layer) 114 may together protect the dielectric layer 106 from being damaged during subsequent processes, such as the surface modification treatment 116 and/or the formation of the etch stop layer 118. For example, carbon depletion may be significantly reduced or prevented in the dielectric layer 106 during the subsequent processes that may involve plasma or ion bombardment. The dielectric constant of the dielectric layer 106 may therefore be maintained at a relatively low level. The RC delay may be reduced and the circuit performance is improved.

Embodiments of the disclosure introduce one or more protection materials into a dielectric layer of an interconnection structure to form a protection region. The protection region is used to protect the dielectric layer from being damaged during subsequent processes, such as one or more processes that involve plasma and/or ion bombardment. Due to the protection of the protection region, the quality and reliability of the interconnection structure are significantly improved.

In accordance with some embodiments, a semiconductor device structure is provided. The semiconductor device structure includes a semiconductor substrate and a dielectric layer over the semiconductor substrate. The dielectric layer has a protection region and a lower portion that is between the protection region and the semiconductor substrate. The protection region contains more carbon than the dielectric layer. The semiconductor device structure also includes a conductive feature penetrating through the protection region, and a lower portion of the conductive feature is surrounded by the lower portion of the dielectric layer.

In accordance with some embodiments, a semiconductor device structure is provided. The semiconductor device structure includes a semiconductor substrate and a dielectric layer over the semiconductor substrate. The dielectric layer has a lower portion and an upper portion, and the upper portion is denser than the lower portion. The semiconductor device structure also includes a conductive feature in the dielectric layer.

In accordance with some embodiments, a method for forming a semiconductor device structure. The method includes forming a dielectric layer over a semiconductor substrate and forming a conductive feature in the dielectric layer. The method also includes forming a protection region in an upper portion of the dielectric layer. The method further includes forming an etch stop layer over the protection region and the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a dielectric layer over the semiconductor substrate, wherein the dielectric layer has a protection region and a lower portion that is between the protection region and the semiconductor substrate, wherein a carbon concentration of the protection region is greater than that of the lower portion of the dielectric layer, a nitrogen concentration of the protection region is greater than that of the lower portion of the dielectric layer, the carbon concentration of the protection region gradually decreases along a direction from a top of the protection region towards the lower portion of the dielectric layer, and the protection region is denser than the lower portion of the dielectric layer; and
a conductive feature penetrating through the protection region, wherein a lower portion of the conductive feature is surrounded by the lower portion of the dielectric layer, and top surfaces of the protection region and the conductive feature are substantially coplanar.

2. The semiconductor device structure as claimed in claim 1, further comprising an etch stop layer over the protection region and the conductive feature.

3. The semiconductor device structure as claimed in claim 1, wherein the protection region has a greater dielectric constant than the lower portion of the dielectric layer.

4. The semiconductor device structure as claimed in claim 1, wherein the protection region is in direct contact with the lower portion of the dielectric layer.

5. The semiconductor device structure as claimed in claim 1, wherein the lower portion of the dielectric layer contains substantially no nitrogen.

6. The semiconductor device structure as claimed in claim 1, wherein the nitrogen concentration of the protection region gradually decreases along a direction from a top of the protection region towards the lower portion of the dielectric layer.

7. A semiconductor device structure, comprising:
a semiconductor substrate;
a dielectric layer over the semiconductor substrate, wherein the dielectric layer has a lower portion and an upper portion, and the upper portion is denser than the lower portion;
a conductive feature in the dielectric layer; and
a protection layer directly on the upper portion of the dielectric layer, wherein pores in the upper portion are at least partially filled with a material diffused from the protection layer, and the protection layer comprises a polymer material.

8. The semiconductor device structure as claimed in claim 7, wherein a nitrogen concentration of the upper portion greater than that of the lower portion.

9. The semiconductor device structure as claimed in claim 7, further comprising an etch stop layer over the dielectric layer and the conductive feature.

10. The semiconductor device structure as claimed in claim 7, wherein a carbon concentration of the upper portion gradually decreases along a direction from a top of the upper portion towards the lower portion of the dielectric layer.

11. The semiconductor device structure as claimed in claim 7, wherein the lower portion is thicker than the upper portion.

12. A method for forming a semiconductor device structure, comprising:
forming a dielectric layer over a semiconductor substrate;
forming a conductive feature in the dielectric layer;
forming a protection material layer on the dielectric layer, wherein the protection material layer comprises a polymer material;
introducing a portion of the protection material layer into an upper portion of the dielectric layer to form a protection region in the upper portion of the dielectric layer, wherein a carbon concentration of the protection region is greater than that of a lower portion of the dielectric layer, a nitrogen concentration of the protection region is greater than that of the lower portion of the dielectric layer, and the protection region is denser than the lower portion of the dielectric layer; and
forming an etch stop layer over the protection region and the conductive feature.

13. The method for forming a semiconductor device structure as claimed in claim 12, further comprising performing a plasma treatment on the protection region and the conductive feature before forming the etch stop layer.

14. The method for forming a semiconductor device structure as claimed in claim 12, further comprising:
applying a protection material solution over the dielectric layer and the conductive feature to form the protection material layer selectively on the dielectric layer; and heating the protection material layer to diffuse the portion of the protection material layer into the upper portion of the dielectric layer to form the protection region.

15. The method for forming a semiconductor device structure as claimed in claim 14, wherein the protection material solution has a pH value in a range from about 2 to about 4.

16. The method for forming a semiconductor device structure as claimed in claim 12, wherein the protection region is formed through heating the protection material layer at a temperature higher than a glass transition temperature of the polymer material.

17. The semiconductor device structure as claimed in claim 1, further comprising a protection layer over the protection region of the dielectric layer, wherein pores in the protection region are at least partially filled with a material diffused from the protection layer.

18. The semiconductor device structure as claimed in claim 1, wherein the protection region has a thickness, and the thickness is in a range from about 10 Å to about 30 Å.

19. The method for forming a semiconductor device structure as claimed in claim 14, wherein the protection material solution comprises charged functional groups.

20. The method for forming a semiconductor device structure as claimed in claim 12, wherein the protection material layer is also formed on the conductive feature during forming the protection material layer on the dielectric layer, wherein adhesion between the protection material layer and the dielectric layer is stronger than adhesion between the protection material layer and the conductive feature; and the method further comprises: removing the protection material layer on the conductive feature before the formation of the etch stop layer.

* * * * *